(12) United States Patent
Hayashi et al.

(10) Patent No.: US 10,440,864 B2
(45) Date of Patent: Oct. 8, 2019

(54) POWER CONVERSION DEVICE

(71) Applicant: Mitsubishi Electric Corporation, Tokyo (JP)

(72) Inventors: Ryohei Hayashi, Tokyo (JP); Goki Furuya, Tokyo (JP); Kohei Ando, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/624,793

(22) Filed: Jun. 16, 2017

(65) Prior Publication Data

US 2018/0132388 A1 May 10, 2018

(30) Foreign Application Priority Data

Nov. 4, 2016 (JP) ................................. 2016-215995

(51) Int. Cl.
    *H05K 7/20*     (2006.01)
    *H02M 7/00*     (2006.01)
    *H02M 7/48*     (2007.01)

(52) U.S. Cl.
CPC ........ *H05K 7/20927* (2013.01); *H02M 7/003* (2013.01); *H02M 7/48* (2013.01);
(Continued)

(58) Field of Classification Search
CPC ........... H05K 7/20218; H05K 7/20254; H05K 7/20272; H05K 7/20281; H05K 7/20409;
(Continued)

(56) References Cited

U.S. PATENT DOCUMENTS

| 2003/0053298 A1* | 3/2003 | Yamada | H05K 7/20872 361/728 |
| 2004/0061138 A1* | 4/2004 | Shinohara | H01L 23/473 257/200 |

(Continued)

FOREIGN PATENT DOCUMENTS

| JP | 2007-097296 A | 4/2007 |
| JP | 2011-17004 A | 9/2011 |

(Continued)

OTHER PUBLICATIONS

Communication dated Oct. 24, 2017 from the Japanese Patent Office in counterpart Japanese application No. 2016-215995.

*Primary Examiner* — Mukundbhai G Patel
*Assistant Examiner* — Zhengfu J Feng
(74) *Attorney, Agent, or Firm* — Sughrue Mion, PLLC; Richard C. Turner

(57) ABSTRACT

A power conversion device such that heat dissipation can be improved is obtained. The power conversion device includes a power conversion circuit unit that converts direct current into alternating current using a semiconductor switching element, a heatsink on which the power conversion circuit unit is mounted, and which has a first passage through which a cooling medium is caused to pass, and a frame body that houses the power conversion circuit unit, seals the power conversion circuit unit between the frame body and the heatsink, and has a second passage through which a cooling medium is caused to pass, wherein the first passage and second passage are connected at an interface between the heatsink and frame body, thereby configuring a cooling passage.

15 Claims, 15 Drawing Sheets

(52) U.S. Cl.
CPC ........... *H05K 7/209* (2013.01); *H05K 7/2089* (2013.01); *H05K 7/20218* (2013.01); *H05K 7/20254* (2013.01); *H05K 7/20272* (2013.01); *H05K 7/20281* (2013.01); *H05K 7/20409* (2013.01); *H05K 7/20509* (2013.01); *H05K 7/20627* (2013.01); *H05K 7/20763* (2013.01); *H05K 7/20845* (2013.01); *H05K 7/20854* (2013.01); *H05K 7/20863* (2013.01); *H05K 7/20872* (2013.01); *H05K 7/20909* (2013.01); *H05K 7/20945* (2013.01)

(58) Field of Classification Search
CPC ........... H05K 7/20509; H05K 7/20627; H05K 7/20763; H05K 7/20845; H05K 7/20854; H05K 7/20863; H05K 7/20872; H05K 7/2089; H05K 7/209; H05K 7/20909; H05K 7/20927; H05K 7/20945

See application file for complete search history.

(56) References Cited

U.S. PATENT DOCUMENTS

| | | |
|---|---|---|
| 2011/0188204 A1 | 8/2011 | Horiuchi et al. |
| 2011/0222239 A1* | 9/2011 | Dede .................... F28F 7/02 361/689 |
| 2012/0063089 A1 | 3/2012 | Kishimoto et al. |
| 2014/0140118 A1 | 5/2014 | Ishikawa et al. |
| 2015/0289411 A1 | 10/2015 | Kamiya et al. |
| 2016/0374235 A1* | 12/2016 | Sakamoto ............ B60K 6/405 |

FOREIGN PATENT DOCUMENTS

| | | |
|---|---|---|
| JP | 2011-192782 A | 9/2011 |
| JP | 2012-060027 A | 3/2012 |
| JP | 2013-045914 A | 3/2013 |
| JP | 2014-082283 A | 5/2014 |
| JP | 2014-102017 A | 6/2014 |
| JP | 2014-108014 A | 6/2014 |
| JP | 2016-105671 A | 6/2016 |
| JP | 2016-146438 A | 8/2016 |

* cited by examiner

POWER CONVERSION DEVICE

BACKGROUND OF THE INVENTION

1. Field of the Invention

The present invention relates to a power conversion device that includes a heat dissipating structure.

2. Description of the Background Art

To date, a heatsink has mainly been installed in a power conversion device with an object of cooling a semiconductor switching element, or the like, which is a heat generating part. However, a heat generating part housed in a frame body is such that although heat is dissipated from a surface in contact with the heatsink, the temperature in a portion not in contact with the heatsink rises due to an operation of the power conversion device, and a configuration is such that heat is dissipated to an interior of the frame from the portion in which the temperature rises, and the temperature in the interior of the frame rises due to the dissipated heat.

A power conversion device wherein heat released into a frame body interior from a heat generating part is dissipated to the exterior of the frame body by an air-cooled heat dissipating structure provided in the frame body, thereby restricting a temperature rise in the frame body interior, has been disclosed as existing technology (for example, refer to Patent Document 1).

Patent Document 1: JP-A-2016-146438

The power conversion device disclosed in Patent Document 1 is such that heat is dissipated into the atmosphere on the exterior of the frame body due to the air-cooled heat dissipating structure provided in the frame body. Because of this, when the ambient temperature of the power conversion device, that is, the temperature of air on the periphery of the power conversion device, is higher than the temperature in the frame body interior, there is a problem in that heat cannot be dissipated from the interior of the frame body to the exterior.

SUMMARY OF THE INVENTION

The invention, having been contrived in order to solve the heretofore described kind of problem, has an object of providing a power conversion device including a heat dissipating structure such that arise in temperature in a frame body interior due to heat dissipated from a heat generating part housed in the frame interior can be restricted, regardless of ambient temperature.

A power conversion device according to the invention includes a power conversion circuit unit that converts direct current into alternating current using a semiconductor switching element, a heatsink on which the power conversion circuit unit is mounted, and which has a first passage through which a cooling medium is caused to pass, and a frame body that houses the power conversion circuit unit, seals the power conversion circuit unit between the frame body and the heatsink, and has a second passage through which a cooling medium is caused to pass, and is characterized in that the first passage and second passage are connected at an interface between the heatsink and frame body, thereby configuring a cooling passage.

According to the power conversion device of the invention, a second passage connected to a first passage provided in a heatsink through which a cooling medium is caused to pass is provided in a frame body that houses a power conversion circuit unit, which is a heat generating part, because of which cooling of the frame body can be carried out simultaneously with cooling of the heatsink, and a temperature rise in an interior of the frame body can be restricted, even in an environment in which the ambient temperature is high.

The foregoing and other objects, features, aspects, and advantages of the invention will become more apparent from the following detailed description of the invention when taken in conjunction with the accompanying drawings.

DETAILED DESCRIPTION OF THE PREFERRED EMBODIMENTS

First Embodiment

Figure 1:
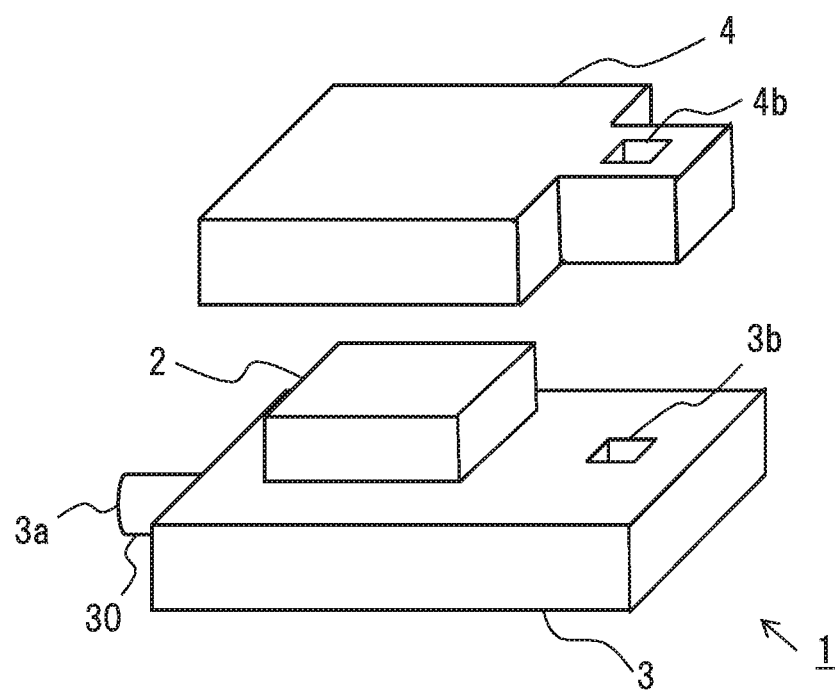
FIG. 1 is an exploded perspective view of a power conversion device of a first embodiment of the invention.
Figure 2:
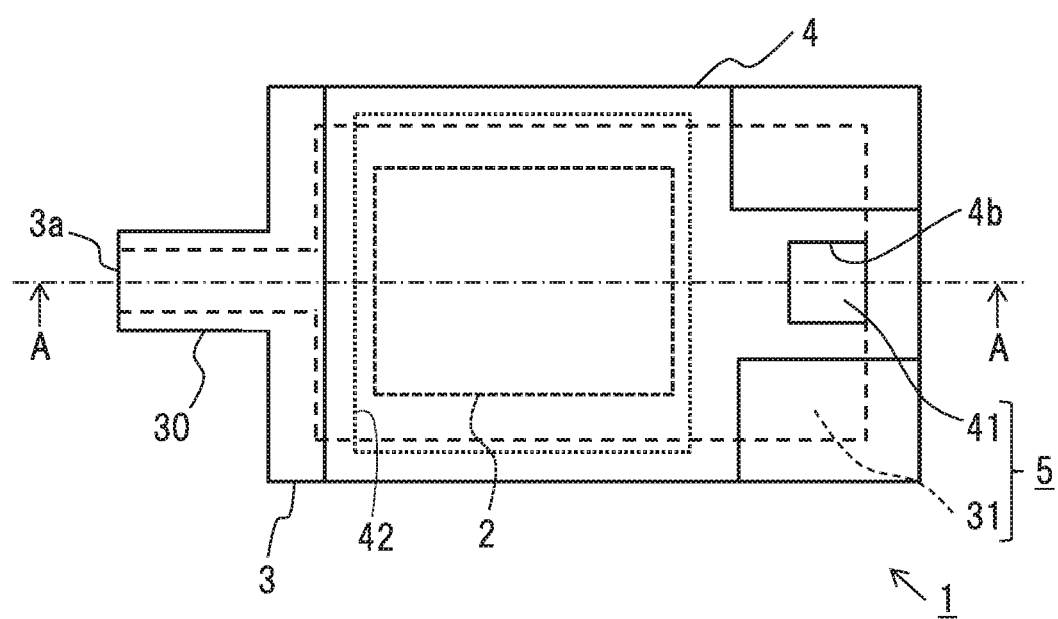
FIG. 2 is a top view of the power conversion device of the first embodiment of the invention.
Figure 3:
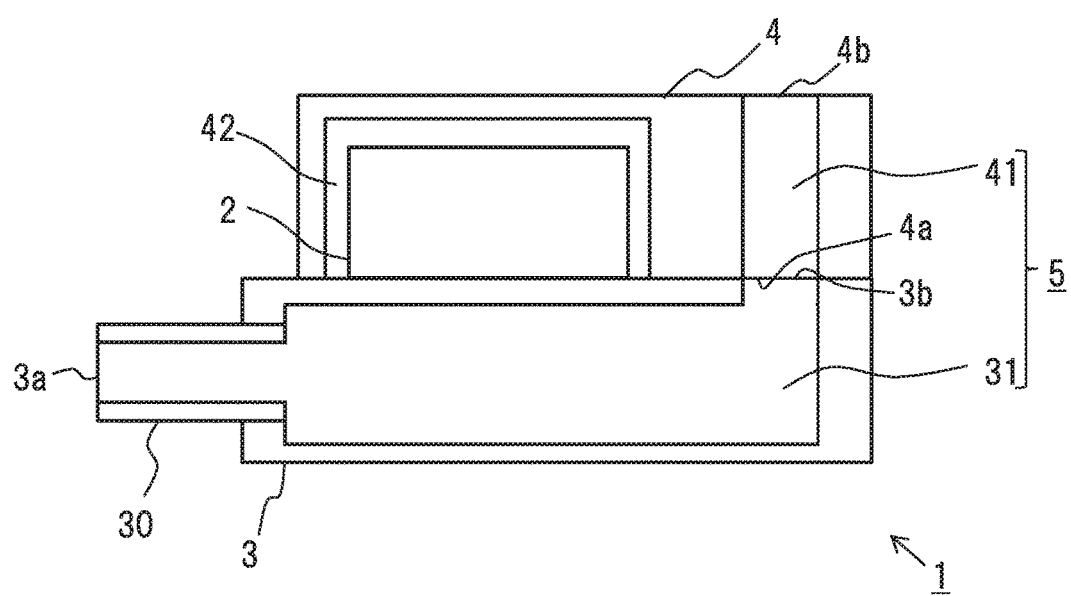
FIG. 3 is an A-A sectional view of FIG. 1.

A power conversion device 1 of a first embodiment of the invention will be described, using FIGS. 1 to 3. FIG. 1 is an exploded perspective view of the power conversion device 1, and FIG. 2 is a top view of the power conversion device 1. Also, FIG. 3 is an A-A sectional view of FIG. 2, and is a diagram showing a series of cooling passages 5 that form a cooling medium passage provided in an interior of a heatsink 3 and frame body 4 configuring the power conversion device 1.

The power conversion device 1, for example, is of a configuration including a power conversion circuit unit 2, which is a heat generating part that converts direct current into alternating current using a semiconductor switching element, and in order to cause heat from the heat generating part to be dissipated, the power conversion device 1 has a heat dissipating structure wherein the cooling passage 5 for causing a cooling medium such as cooling water to pass through is provided not only on the heatsink 3 side, but also on the frame body 4 side.

As shown in FIGS. 1 and 2, the power conversion device 1 includes the power conversion circuit unit 2, which includes an inverter circuit or the like, the heatsink 3, on which the power conversion circuit unit 2 is mounted, and the frame body 4, which has a frame body housing portion 42 that seals the power conversion circuit unit 2 between the heatsink 3 and frame body housing portion 42 and houses the power conversion circuit unit 2.

For example, a connection portion 30 protruding from a base portion of the heatsink 3 to an exterior is provided in the heatsink 3 in order to cause a cooling medium to pass through. A cooling passage end portion 3a, which forms one end portion of a first passage 31 that penetrates the heatsink 3 and is for causing a cooling medium to flow in or flow out, is opened in the connection portion 30. Another end portion of the first passage 31 that penetrates the heatsink 3 forms an aperture portion 3b opened in an upper surface side (the same as the surface on which the power conversion circuit unit 2 is mounted) joined to the frame body 4.

A second passage 41, which is connected to the first passage 31 of the heatsink 3 and configures the series of cooling passages 5 in conjunction with the first passage 31, is provided in the frame body 4.

As heretofore described, one end portion of the cooling passage 5 is the cooling passage end portion 3a opened in the connection portion 30, and as shown in FIG. 2, a cooling passage end portion 4b, which forms another end portion of the cooling passage 5, is opened on an upper surface side of the power conversion device 1.

Herein, the heatsink 3 can be configured of, for example, aluminum, but can also be configured of a metal with good thermal conductivity, such as copper.

Also, the frame body 4 can be configured of, for example, aluminum, but can also be configured of a metal or resin with good thermal conductivity. When fabricating the frame body 4 using metal, it is desirable in terms of productivity that a metal with high thermal conductivity that can be die cast can be used, and that the frame body 4 is configured of a material with a low melting point, such as an aluminum alloy or a zinc alloy. Further, provided that the material of the frame body 4 is a material with high thermal conductivity, the material is not limited to metal, and a resin material that can be molded can also be used.

As shown in FIG. 3, the aperture portion 3b of the first passage 31 penetrating the heatsink 3 on the side of the surface joining with the frame body 4, and an aperture portion 4a of the second passage 41 penetrating the frame body 4 on the side of the surface joining with the heatsink 3, are linked, and the series of cooling passages 5 formed by the first passage 31 and second passage 41 is obtained. Further, one end portion of the cooling passage 5 is provided in the heatsink 3, while another end portion is provided in the frame body 4.

Herein, for example, cooling water can be used as a cooling medium caused to pass through the cooling passage 5, and the cooling passage 5 forms a water conducting portion. A long life coolant (LLC) can be used as cooling water, but as oil cooling can also be adopted, an automatic transmission fluid (ATF) or the like can also be used.

Not only a liquid, but also a cooling gas or the like, which is a gas, can be used as a cooling medium.

By the cooling passage 5 shown in FIG. 3 being used, cooling water used in cooling the heatsink 3 can also be caused to circulate to the frame body 4 side, whereby the frame body 4 can be actively cooled. Therefore, a temperature rise in the interior of the frame body 4 can be restricted using cooling water, even in an environment in which the ambient temperature becomes high. Because of this, according to the first embodiment, a stable operating state of the power conversion device 1 in a high temperature environment can be maintained.

In the first embodiment, for example, the cooling passage end portion 3a on the heatsink 3 side of the cooling passage 5 is taken to be a water conducting path inlet, and the cooling passage end portion 4b on the frame body 4 side is taken to be a water conducting path outlet, but it goes without saying that the cooling medium inlet and outlet can also be utilized in a reverse direction.

Furthermore, a heat dissipating structure including the cooling passage 5 with this configuration is such that temperature-regulated water is used as a cooling medium, whereby a temperature rise in the frame body housing portion 42 is restricted, and regulation for keeping the temperature of the power conversion device 1 at a predetermined temperature, or the like, can also be carried out.

The first passage 31 and second passage 41 of the cooling passage 5 shown in FIGS. 2 and 3 are configured of approximately linear cavity portions that penetrate the heatsink 3 and frame body 4 respectively in one direction, but the passage form can be changed into a form that gains passage length by, for example, causing the passage to curve or wind.

Also, the heretofore described example shows a case in which one cooling passage 5 is provided inside one power conversion device 1, but by disposing a multiple of cooling passages 5 in parallel in the same device, a change can be made so that a multiple of independent cooling passages are provided in the device.

Furthermore, the example in FIGS. 2 and 3 shows a case in which the first passage 31 has a greater sectional area than the second passage 41, but this not being limiting, it goes without saying that the first passage 31 and second passage 41 can be provided with the passage sectional areas adjusted as appropriate in accordance with a necessary heat dissipating performance.

Second Embodiment

Next, the power conversion device 1 of a second embodiment of the invention will be described, using FIGS. 4 and 5. In addition to the configuration of the first embodiment, the power conversion device 1 according to the second embodiment is characterized in that packing is used in a joint between the heatsink 3 and frame body 4.

Figure 4:
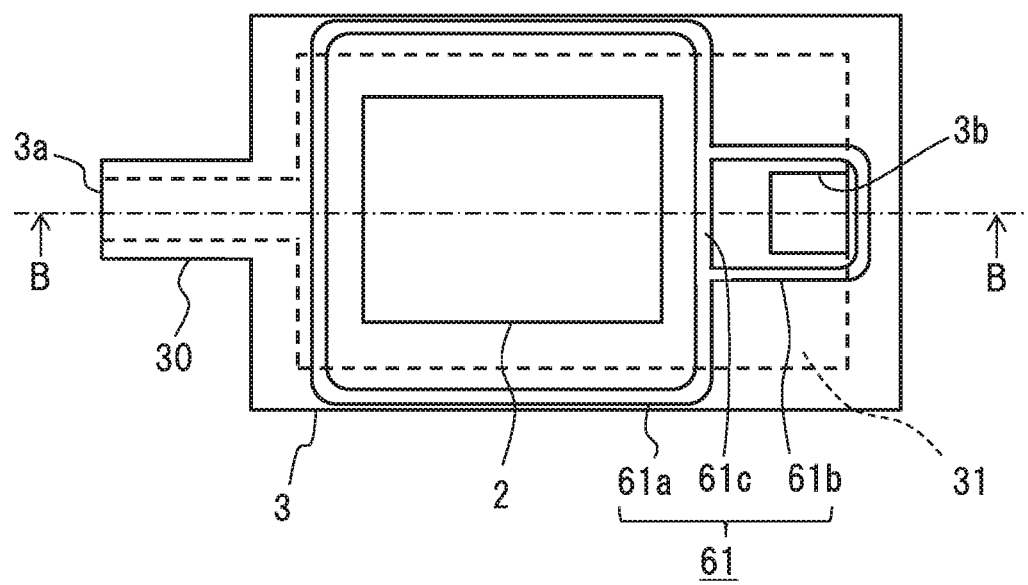
FIG. 4 is a top view of a heatsink of a power conversion device of a second embodiment of the invention.

FIG. 4 is a top view of the heatsink 3, wherein an upper surface of the heatsink 3 is a surface joining with the frame body 4. As shown in FIG. 4, a circuit unit packing 61a is provided in a periphery of the frame body housing portion 42 of the frame body 4, a cooling passage portion packing 61b is provided in a periphery of the aperture portion 3b of the heatsink 3, and the circuit unit packing 61a and cooling passage portion packing 61b are connected, and thereby integrated, by a packing connection portion 61c connecting the two. Herein, the integrated packing is called an integrated packing 61.

Figure 5:
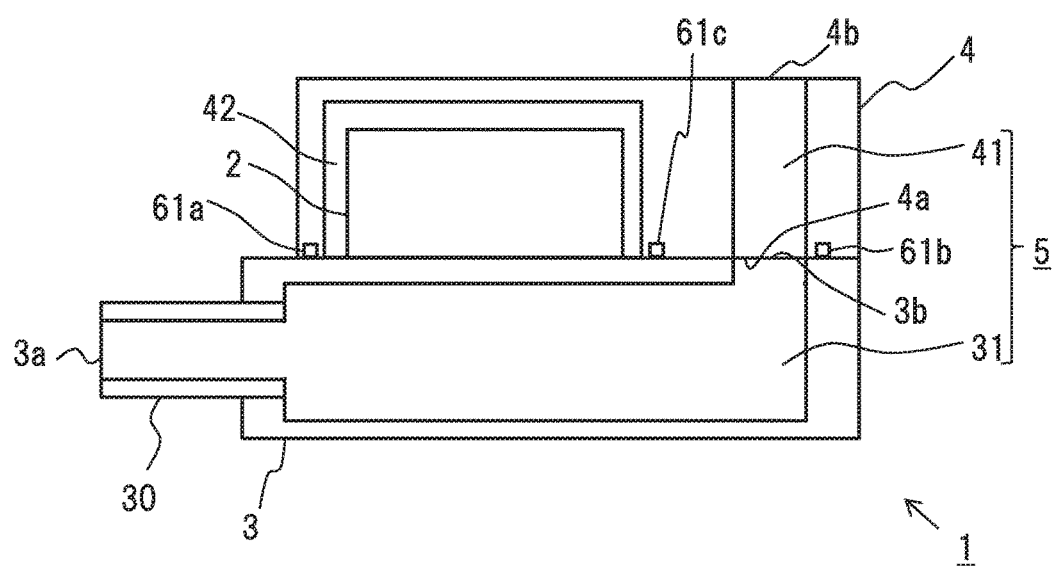
FIG. 5 is a sectional view of the power conversion device of the second embodiment of the invention.

A sectional view of the power conversion device 1 corresponding to a B-B section of FIG. 4 is shown in FIG. 5, with the sectional view showing installation places of the circuit unit packing 61a, cooling passage portion packing 61b, and packing connection portion 61c, which are the components of the integrated packing 61.

By the integrated packing 61 being installed between the frame body 4 and heatsink 3, as shown in FIG. 5, the first passage 31 and second passage 41 are connected with watertightness of a connection portion between the two passages maintained by the cooling passage portion packing 61b, and by the power conversion circuit unit 2 installed inside the frame body housing portion 42 being sealed while waterproofing and dust resistance between the frame body 4 and heatsink 3 are maintained by the circuit unit packing 61a, the circuit unit can be protected from external water and foreign objects. Therefore, the power conversion device 1 can be stably operated in a high temperature environment.

According to the second embodiment, the circuit unit packing 61a that seals the power conversion circuit unit 2, and the cooling passage portion packing 61b that connects the first passage 31 and second passage 41, form mutually independent sealing regions. Therefore, protection of the interior of the frame body housing portion 42 of the frame body 4 from invasive objects by the circuit unit packing 61a, and maintaining of watertightness of the cooling passage 5 by the cooling passage portion packing 61b, can be carried out independently.

Further, as it is sufficient that one integrated packing 61 is disposed between the heatsink 3 and frame body 4, the power conversion device 1 can have excellent assemblability.

Packing fabricated of, for example, rubber can be used as the integrated packing 61, in addition to which the integrated packing 61 can also be configured of a metal gasket, a seal formed of a composite material of metal and rubber, or the like.

Herein, when packing such as an O-ring is used as the integrated packing 61, for example, the integrated packing 61 is disposed by a depressed portion being provided in a place on the frame body 4 joining surface side or heatsink 3 joining surface side in which the packing is to be disposed. Meanwhile, when the integrated packing 61 is a metal gasket or the like, a sealing portion can be configured by flat surfaces being brought together.

Third Embodiment

Next, the power conversion device 1 of a third embodiment of the invention will be described, using FIGS. 6 and 7. In the second embodiment, a description has been given of the integrated packing 61, but a separated packing 62 wherein a circuit unit packing 62a, which seals the power conversion circuit unit 2 housed in the frame body housing unit 42, and a cooling passage portion packing 62b, which seals the cooling passage 5, are separated from each other, thereby forming independent sealing regions, is used in the third embodiment, as shown in a top view of the heatsink 3 in FIG. 6.

Figure 6:
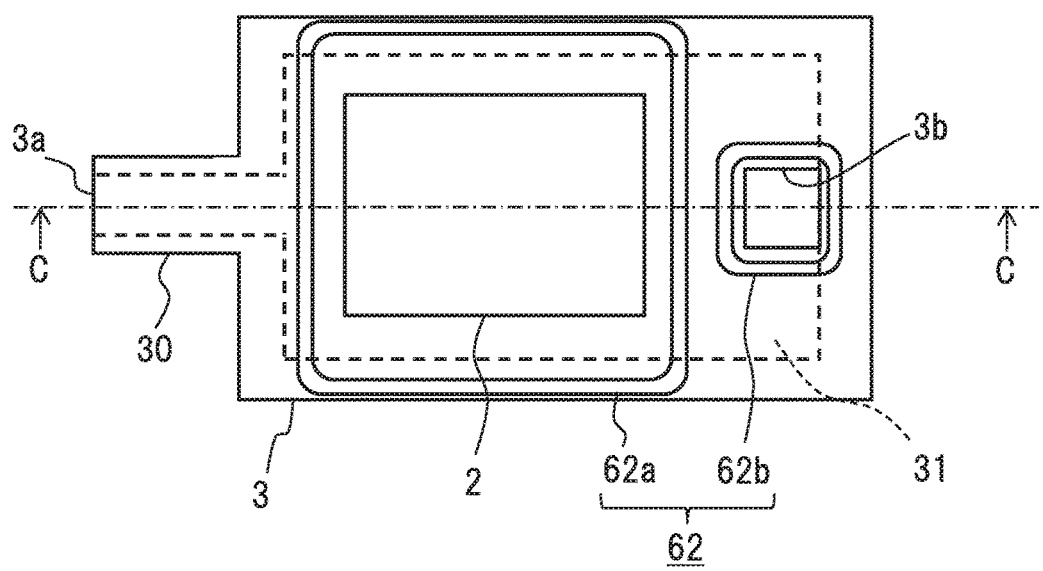
FIG. 6 is a top view of a heatsink of a power conversion device of a third embodiment of the invention.
Figure 7:
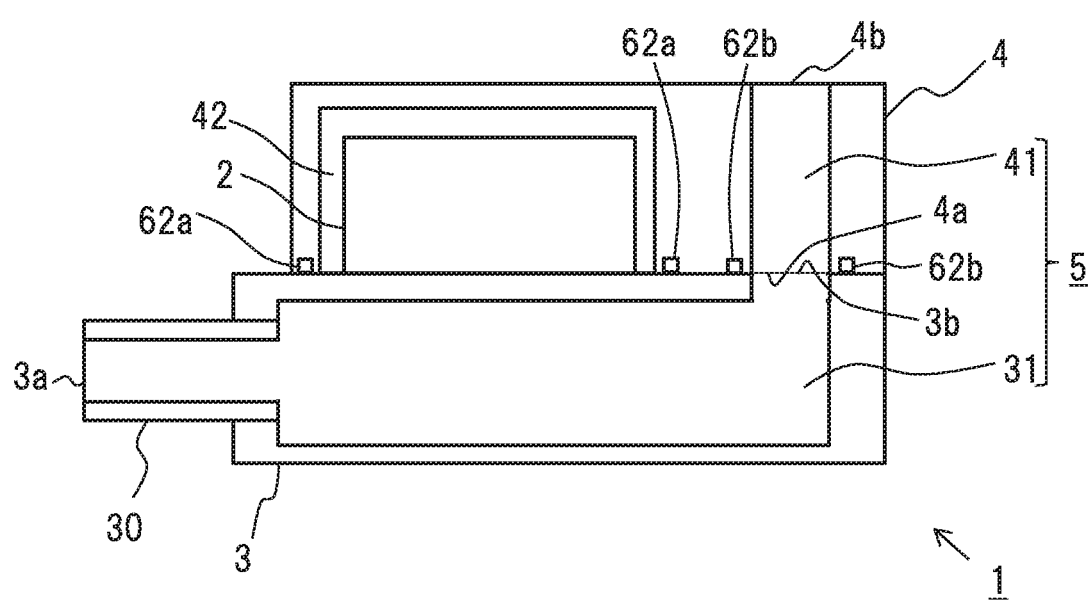
FIG. 7 is a sectional view of the power conversion device of the third embodiment of the invention.

A sectional view of the power conversion device 1 corresponding to a C-C section of FIG. 6 is shown in FIG. 7, with the sectional view showing installation places of the circuit unit packing 62a and cooling passage portion packing 62b, which are the components of the separated packing 62.

By the circuit unit packing 62a and cooling passage portion packing 62b configuring the separated packing 62 being disposed between the frame body 4 and heatsink 3, as shown in FIG. 7, watertightness of a connection portion between the first passage 31 and second passage 41 is maintained by the cooling passage portion packing 62b, waterproofing and dust resistance between the frame body 4 and heatsink 3 are maintained by the circuit unit packing 62a, and the power conversion circuit unit 2 disposed inside the frame body housing portion 42 is sealed, whereby the circuit unit can be protected from external water and foreign objects, in the same way as in the case of the second embodiment.

Furthermore, according to the third embodiment, the packing is of a separated structure wherein the cooling passage portion packing 62b, which maintains the watertightness of the cooling passage 5, and the circuit unit packing 62a, which protects the interior of the frame body housing portion 42 of the frame body 4 from invasive objects, are separated from each other, and the sealing regions are independent, because of which a different material can be selected for each packing, parts can be replaced individually, and the like.

Because of this, even when, for example, a problem occurs in the cooling passage portion packing 62b of the separated packing 62 and a cooling water leak occurs, leaking into the interior of the frame body housing portion 42 can be prevented by the circuit unit packing 62a, and reliability of the power conversion device 1 can be maintained.

The same materials as for the heretofore described integrated packing can be used for the separated packing 62.

Fourth Embodiment

In the first to third embodiments, an inlet (or outlet) that forms one end portion of the cooling passage 5 through which cooling water is caused to pass is provided in the heatsink 3, and an outlet (or inlet) that forms the other end portion of the cooling passage 5 is provided in the frame body 4, but the outlet and inlet (both end portions) can be gathered in the heatsink 3 or frame body 4 by providing a multiple of connection portions of the cooling passage 5 between the heatsink 3 and frame body 4, forming a channel that causes the cooling water to do a U-turn.

In a fourth embodiment, using FIGS. 8 to 11, the power conversion device 1 wherein both end portions of the cooling passage 5 are gathered in the heatsink 3, and one portion of the cooling passage 5 is also caused to pass through the frame body 4 side, will be exemplified and described.

Figure 8:
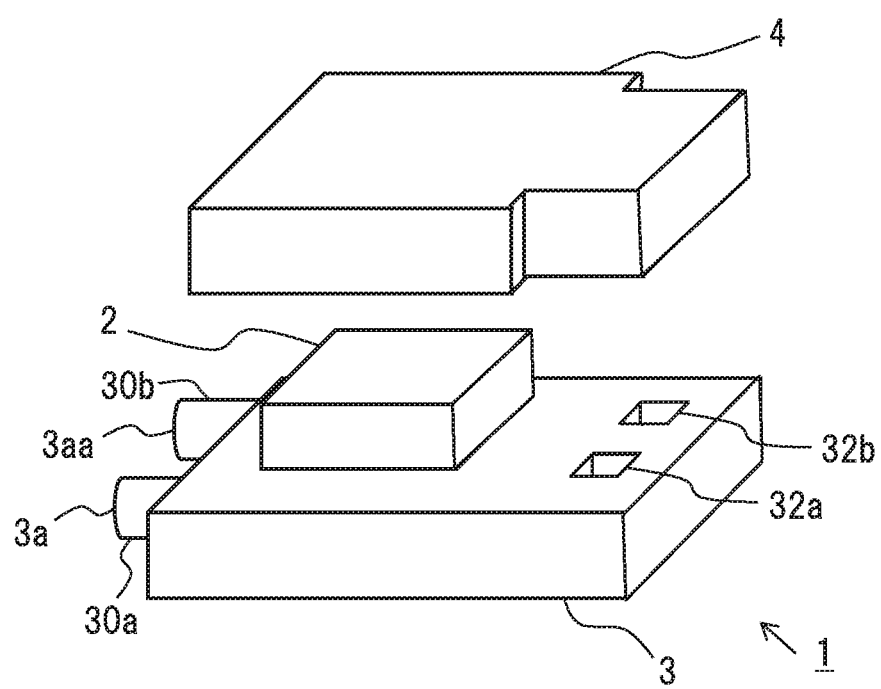
FIG. 8 is an exploded perspective view of a power conversion device of a fourth embodiment of the invention.

FIG. 8 is an exploded perspective view of the power conversion device 1 according to the fourth embodiment. As shown in FIG. 8, a first connection portion 30a, which forms one end side of a cooling passage, and a second connection portion 30b, which forms another end side of the cooling passage, are provided on the heatsink 3 side, and a heatsink side first aperture portion 32a and heatsink side second aperture portion 32b connected to a cooling passage on the frame body 4 side are opened in the surface of the heatsink 3 joining the frame body 4.

Herein, the cooling passage end portion 3a, which forms a cooling medium inlet (or outlet), is provided in the first connection portion 30a and, for example, connected to the heatsink side first aperture portion 32a via a first passage 33a, which is the cooling passage 5, inside the heatsink 3. Also, a cooling passage end portion 3aa, which forms a cooling medium outlet (or outlet), is provided in the second connection portion 30b and, for example, connected to the heatsink side second aperture portion 32b via another cooling passage inside the heatsink 3.

Figure 9:
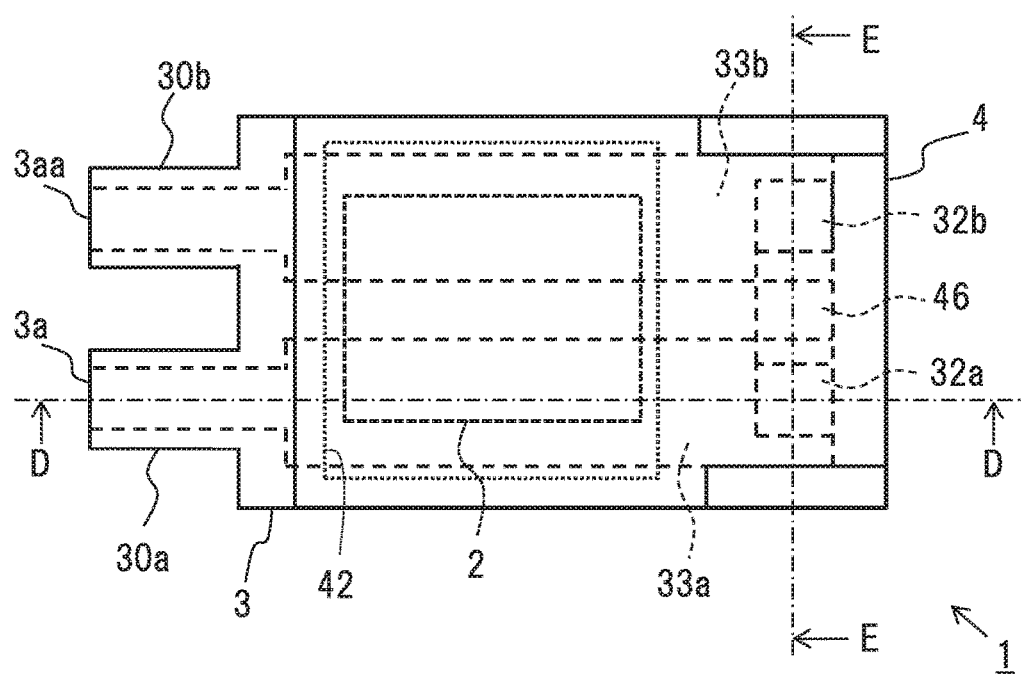
FIG. 9 is a top view of the power conversion device of the fourth embodiment of the invention.

FIG. 9 is a top view of the power conversion device 1 of FIG. 8, and shows that two first passages 33a and 33b disposed in parallel, which extend parallel to a surface on which the power conversion circuit unit 2 is mounted, are provided inside the heatsink 3, and a U-form second passage 46 is provided inside the frame body 4. Further, the first passages 33a and 33b inside the heatsink 3 are provided as a cooling medium outward passage (or return passage) and return passage (or outward passage).

That is, the first passage 33a on the heatsink 3 side is connected via the heatsink side first aperture portion 32a to one aperture portion of the U-form second passage 46, which has a multiple of aperture portions in the surface of the frame body 4 joining the heatsink 3. Further, the first passage 33b on the heatsink 3 side is connected via the heatsink side second aperture portion 32b to another aperture portion of the U-form second passage 46.

Figure 10:
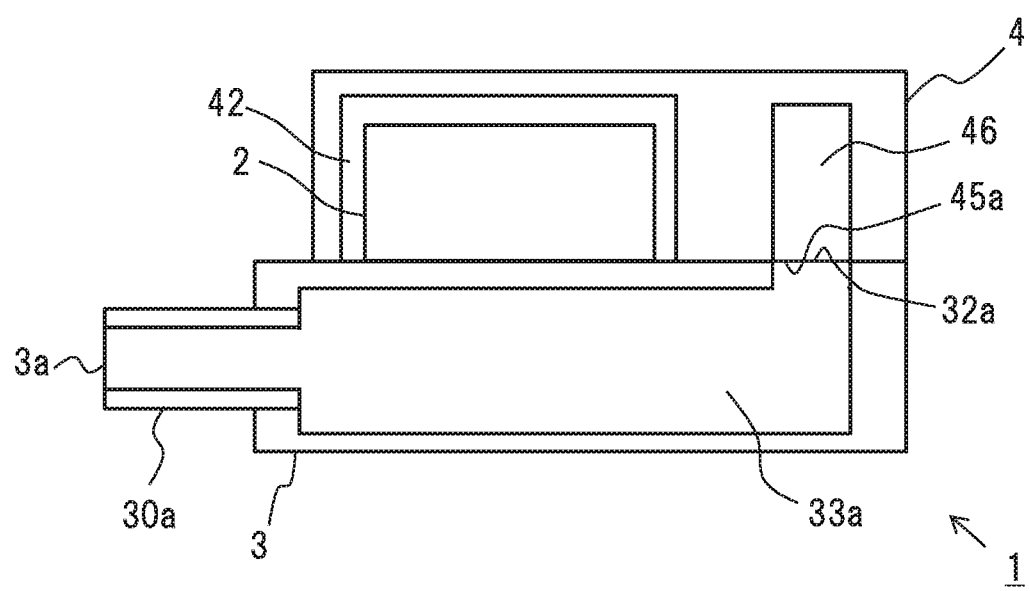
FIG. 10 is a D-D sectional view of FIG. 9.

FIG. 10 is a D-D sectional view of FIG. 9. In the first to third embodiments, the second passage 41 on the frame body 4 side is provided in a state penetrating in a thickness direction of the frame body 4 (a direction of thickness from the surface joining the heatsink 3 to an upper surface), but the U-form second passage 46 provided in the frame body 4 of the fourth embodiment is such that both end portions thereof are opened in the same surface (the surface joining the heatsink 3), and the channel is of a U-turn form. Because of this, the U-form second passage 46 does not penetrate to the upper surface side of the frame body 4. Also, as shown in the example in FIG. 10, a frame body side first aperture portion 45a, which is one end portion of the U-form second passage 46, is connected to the heatsink side first aperture portion 32a of the first passage 33a on the heatsink 3 side.

Figure 11:
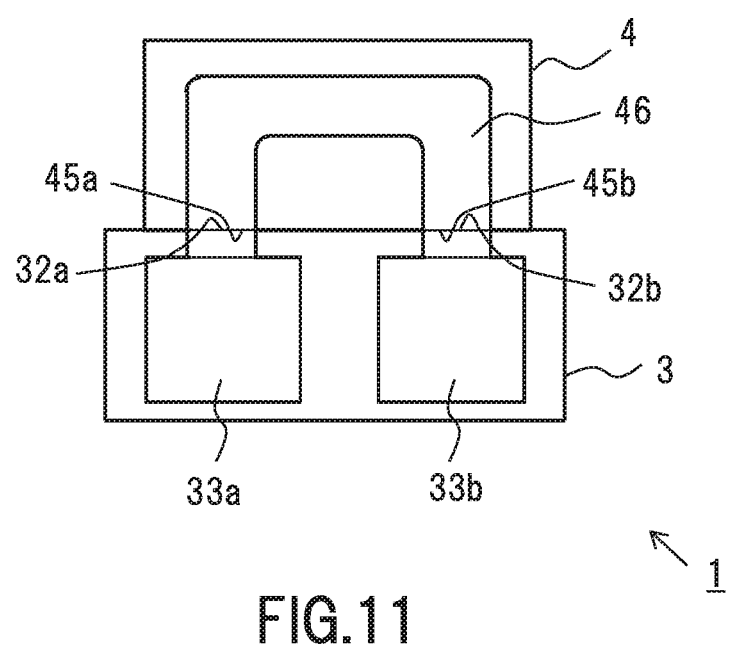
FIG. 11 is an E-E sectional view of FIG. 9.

FIG. 11 is an E-E section of FIG. 9. The U-form second passage 46, with the frame body side first aperture portion 45a and a frame body side second aperture portion 45b opened downward so as to face the surface joining the heatsink 3, is provided curved into a U-form so as to gain cooling medium path length in the interior of the frame body 4.

A case in which the first passages 33a and 33b on the heatsink 3 side are configured so as to extend linearly is shown in the example of FIGS. 9 and 10, but each passage can be changed to a winding or curved form when using, and the sectional area of a passage can be adjusted as appropriate when using.

As heretofore described, the first passages 33a and 33b of the power conversion device 1 according to the fourth embodiment are such that a cooling passage is provided so as to form a series via the U-form second passage 46. Further, the U-form second passage 46 provided on the frame body 4 side is of a configuration such that a sectional form thereof is a U-form, a cooling medium is introduced from the frame body side first aperture portion 45a or frame body side second aperture portion 45b opened in the interface between the heatsink 3 and frame body 4, and the cooling medium is ejected from the frame body side second aperture portion 45b or frame body side first aperture portion 45a. Further, the two first passages 33a and 33b are provided in the heatsink 3 and connected respectively to the frame body side first aperture portion 45a and frame body side second aperture portion 45b positioned in a portion of the surface joining the frame body 4, and both end portions of the cooling passage are provided in the heatsink 3. Therefore, a structure such that the cooling medium inlet and outlet are gathered on the heatsink 3 side can be adopted.

Also, the cooling medium inlet and outlet can also be gathered on the frame body 4 side, in which case a configuration includes two second passages penetrating the frame body 4 in parallel, and a U-form first passage, provided inside the heatsink 3, such that both ends of a cooling passage are opened in the surface joining the frame body 4, and a state is such that one end of the U-form first passage is connected to one second passage, and the other end of the U-form first passage is connected to the other second passage.

By a multiple of water conducting path connection portions between the heatsink 3 and frame body 4 being provided in this way, a cooling passage with a complex path such that a cooling medium is caused to pass from the cooling passage end portion 3a (inlet) on the heatsink 3 side via the interior of the heatsink 3 (a portion including a region directly below a heat generating part) to the frame body 4, and subsequently caused to pass to the cooling passage end portion 3aa (outlet) of the heatsink 3 again, can be configured.

Fifth Embodiment

The power conversion device 1 of the first to fourth embodiments is of a configuration such that the cooling passage that causes the cooling medium to pass through the heatsink 3 and frame body 4 is a series, and follows one path. However, a form wherein one cooling passage is divided into a multiple of cooling passages in the interior of the heatsink 3 or frame body 4, or alternatively, when a coolant flow is seen in reverse, a form wherein a multiple of cooling passages are caused to converge into one, can be adopted.

In a fifth embodiment, using FIGS. 12 and 13, a description will be given of an example of the power conversion device 1 having a divided cooling passage structure.

Figure 12:
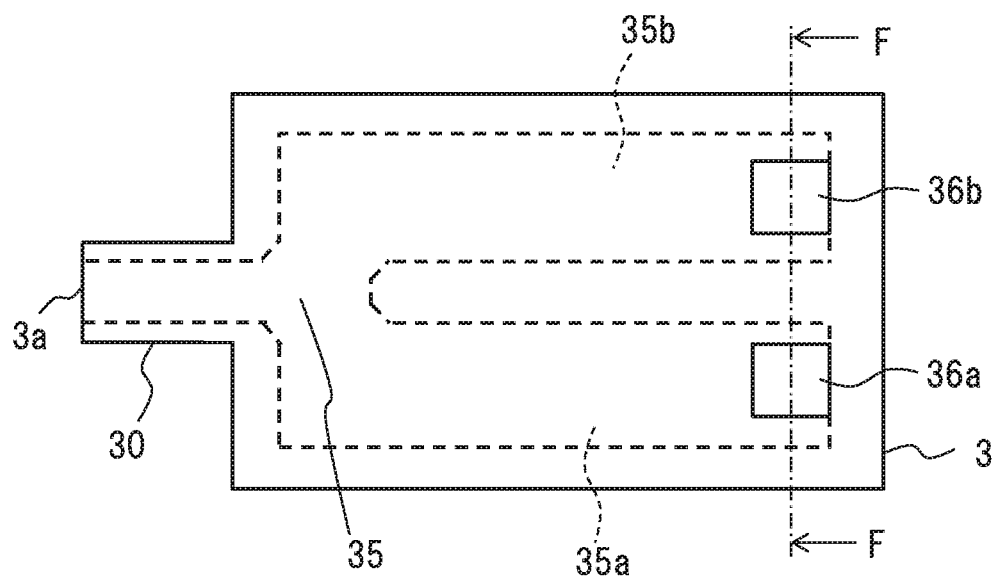
FIG. 12 is a top view of a heatsink of a power conversion device of a fifth embodiment of the invention.

FIG. 12 is a top view of the heatsink 3 of the power conversion device 1 according to the fifth embodiment, wherein the connection portion 30 forming one end side of a cooling passage is provided on the heatsink 3 side, and a heatsink side first aperture portion 36a and heatsink side second aperture portion 36b connected to a cooling passage on the frame body 4 side are opened in a surface of the heatsink 3 joining the frame body 4. One cooling passage connected to the cooling passage end portion 3a inside the heatsink 3 divides into two passages, those being first passages 35a and 35b, at a division portion 35, and the first passages 35a and 35b are connected respectively to the heatsink side first aperture portion 36a and heatsink side second aperture portion 36b opened in the surface joining the frame body 4.

Figure 13:
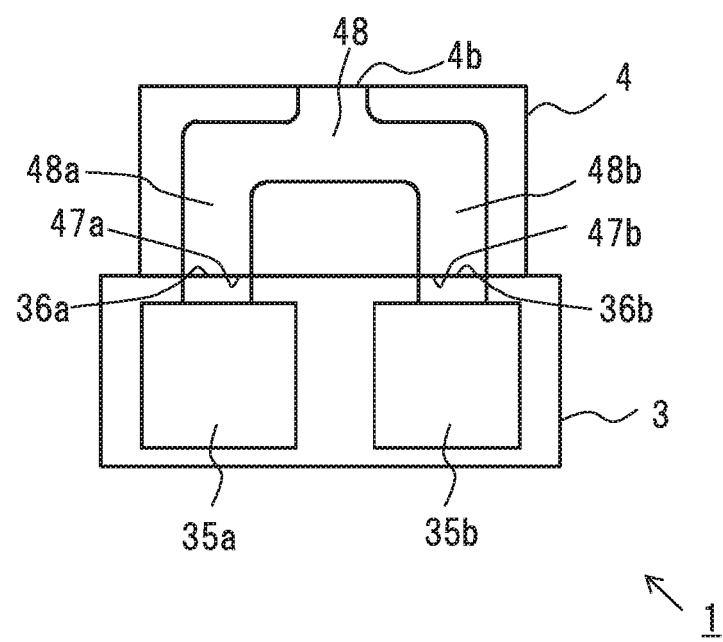
FIG. 13 is a sectional view of the power conversion device of the fifth embodiment of the invention.

Next, a sectional view of the power conversion device 1 corresponding to an F-F section of FIG. 12 is shown in FIG. 13, and a description will be given of a convergence of a multiple of cooling passages on the frame body 4 side. As shown in FIG. 13, the heatsink side first aperture portion 36a is connected to a second passage 48a on the frame body 4 side, and the heatsink side second aperture portion 36b is connected to a second passage 48b on the frame body 4 side. The second passage 48a, connected to a first aperture portion 47a, and the second passage 48b, connected to a second aperture portion 47b, extend in parallel inside the frame body 4 and are gathered at a convergence portion 48, where the paths thereof become one, and are connected to the cooling passage end portion 4b opened on an upper surface side of the frame body 4.

By adopting a divided or converged structure for the cooling passage in this way, the structure can be such that channel length is gained in a portion for which it is wished to improve heat dissipation.

The examples of FIGS. 12 and 13 show a cooling passage of a form such that there is one coolant inlet and one coolant outlet provided in the heatsink 3 or frame body 4, and the coolant passage is divided into two partway along the channel, but the path can also be divided into a larger number such as three, four, and so on.

Also, the heretofore described example shows a case in which a cooling passage divided into two is caused to converge into one and connected to the exterior, but rather than causing a multiple of channels to converge, an aspect such that the channels are connected to the exterior still divided can be adopted.

Sixth Embodiment

In the power conversion device 1 of the first to fifth embodiments, there is a tendency for the temperature of the heatsink 3 to rise noticeably in the region in which the power conversion circuit unit 2 is mounted. Therefore, for the sake of improving heat dissipation, it is desirable that heat dissipation in a region of the heatsink 3 directly below the power conversion circuit unit 2 is improved. Therefore, using FIGS. 14 and 15, a description will be given in a sixth embodiment of a modification wherein heat dissipation is improved in a region in which temperature rise is noticeable, such as a region of the heatsink 3 directly below the power conversion circuit unit 2.

Figure 14:
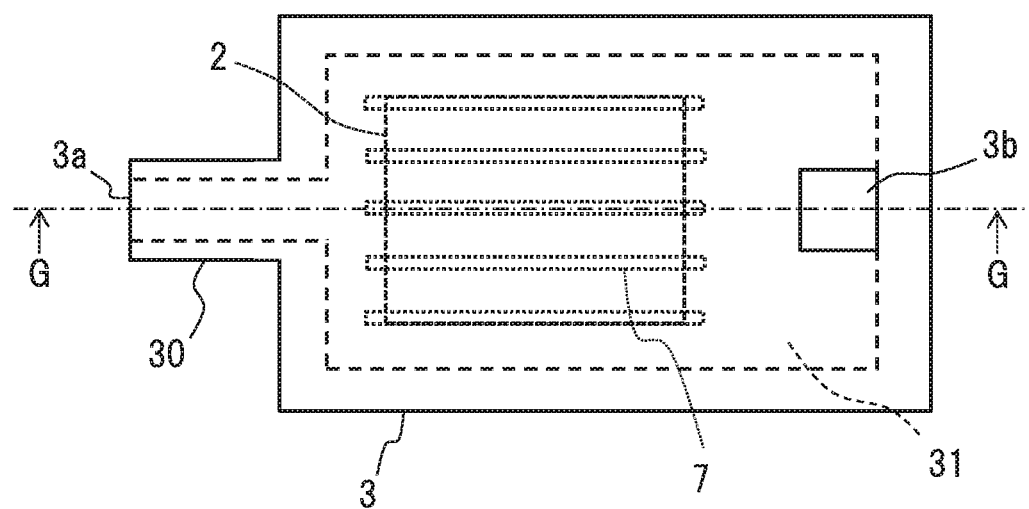
FIG. 14 is a top view of a heatsink of a power conversion device of a sixth embodiment of the invention.

FIG. 14 is a top view of the heatsink 3 used in the power conversion device 1 of the sixth embodiment. The heatsink 3 includes a fin 7 protruding into the passage from a wall surface portion on the side on which the power conversion circuit unit 2 is mounted of the first passage 31 through which a cooling medium flows.

Figure 15:
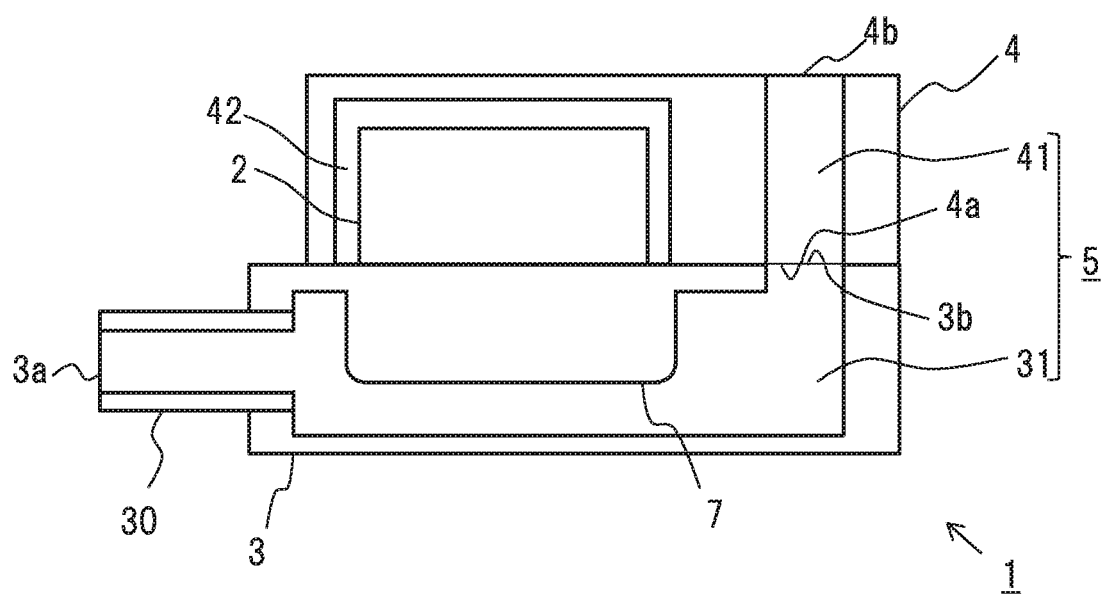
FIG. 15 is a sectional view of the power conversion device of the sixth embodiment of the invention.

Further, the fin 7 is of a form extended along the flow of the cooling medium, and formed so as not to impede the flow of the cooling medium, as shown in FIG. 15 in a sectional view of the power conversion device 1 corresponding to a G-G section of FIG. 14.

The fin 7 is provided in the cooling passage on the heatsink 3 side of the power conversion device 1 so as to protrude on a lower side of the passage from a wall surface (inner wall top surface) on a side near the power conversion circuit unit 2, whereby contact area between the fin 7 and the cooling medium can be secured, and heat dissipation can be improved, even in a state in which the first passage 31 is not filled with the liquid cooling medium as far as the top surface thereof.

By adopting a configuration such that the fin 7 is provided in the cooling passage of the heatsink 3 positioned below a switching element that generates a large amount of heat, and the fin 7 is not provided in other portions of the cooling passage (portions in which a temperature rise is not noticeable), as in the power conversion device 1 of the sixth embodiment, pressure loss in the overall device can be reduced.

When focusing on the heat dissipating structure of the frame body 4, a temperature rise in the second passage 41 is most noticeable in an inner wall portion on a side near the power conversion circuit unit 2. Therefore, by adopting a configuration such that a fin is exclusively provided in an inner wall portion on a side of the second passage 41 near the heat generating part, heat dissipation on the frame body 4 side can be further improved, while restricting pressure loss in the overall device.

The embodiments of the invention can be freely combined, and each embodiment can be modified or abbreviated as appropriate, without departing from the scope of the invention.

What is claimed is:

1. A power conversion device, comprising:
a power conversion circuit unit that converts direct current into alternating current using a semiconductor switching element;
a heatsink on which the power conversion circuit unit is mounted, and which has a first passage through which a cooling medium is caused to pass, the first passage having a first aperture; and
a frame body that houses the power conversion circuit unit, seals the power conversion circuit unit between the frame body and the heatsink, and has a second passage through which the cooling medium is caused to pass, the second passage forming a second aperture facing the first aperture,
wherein the first passage and the second passage are connected at an interface between the heatsink and the frame body, thereby configuring a cooling passage formed of the first passage and the second passage that are provided to form a series,
the second passage is formed in a U-form, the second aperture comprises a first aperture portion and a second aperture portion that are opened in the interface,
the cooling medium is introduced into the second passage from the first aperture portion and is ejected from the second aperture portion,
the first passage comprises two passages provided in the heatsink and connected to the first aperture portion and the second aperture portion, respectively, and
both end portions of the cooling passage are provided in the heatsink.

2. The power conversion device according to claim 1, wherein the cooling passage formed of the first passage and the second passage and has a structure divided partway along.

3. The power conversion device according to claim 2, wherein the cooling passage is of a structure converged in the heatsink or the frame body.

4. The power conversion device according to claim 1, wherein the heatsink includes a fin that protrudes into the first passage from a wall surface portion of the first passage on a side on which the power conversion circuit unit is mounted.

5. The power conversion device according to claim 1, wherein the cooling medium is a liquid.

6. A power conversion device comprising:
a power conversion circuit unit that converts direct current into alternating current using a semiconductor switching element;
a heatsink on which the power conversion circuit unit is mounted, and which has a first passage through which a cooling medium is caused to pass, the first passage having a first aperture; and
a frame body that houses the power conversion circuit unit, seals the power conversion circuit unit between the frame body and the heatsink, and has a second passage through which the cooling medium is caused to pass, the second passage forming a second aperture facing the first aperture,
wherein the first passage and the second passage are connected at an interface between the heatsink and the frame body, thereby configuring a cooling passage formed of the first passage and the second passage that are provided to form a series,
the first passage is formed in a U-form,
the first aperture comprises a first aperture portion and a second aperture portion that are opened in the interface,
the cooling medium is introduced from the first aperture portion and ejected from the second aperture portion,
the second passage comprises two passages provided in the frame body and connected to the first aperture portion and the second aperture portion, respectively, and
both end portions of the cooling passage are provided in the frame body.

7. The power conversion device according to claim 6, wherein the cooling passage formed of the first passage and the second passage and has a structure divided partway along.

8. The power conversion device according to claim 7, wherein the cooling passage is of a structure converged in the heatsink or the frame body.

9. The power conversion device according to claim 6, wherein the heatsink includes a fin that protrudes into the first passage from a wall surface portion of the first passage on a side on which the power conversion circuit unit is mounted.

10. The power conversion device according to claim 6, wherein the cooling medium is a liquid.

11. A power conversion device comprising:
a power conversion circuit unit that converts direct current into alternating current using a semiconductor switching element;
a heatsink on which the power conversion circuit unit is mounted, and which has a first passage through which a cooling medium is caused to pass; and
a frame body that houses the power conversion circuit unit, seals the power conversion circuit unit between the frame body and the heatsink, and has a second passage through which the cooling medium is caused to pass,
wherein the first passage and the second passage are connected at an interface between the heatsink and the frame body, thereby configuring a cooling passage,
the power conversion circuit unit is sealed between the heatsink and the frame body across a first packing,
the first passage and the second passage are connected at the interface between the heatsink and the frame body across a second packing, and
the first packing and the second packing are integral with each other.

12. The power conversion device according to claim 11, wherein the cooling passage formed of the first passage and the second passage and has a structure divided partway along.

13. The power conversion device according to claim 12, wherein the cooling passage is of a structure converged in the heatsink or the frame body.

14. The power conversion device according to claim 11, wherein the heatsink includes a fin that protrudes into the first passage from a wall surface portion of the first passage on a side on which the power conversion circuit unit is mounted.

15. The power conversion device according to claim 11, wherein the cooling medium is a liquid.

* * * * *